(12) United States Patent
Ishibashi

(10) Patent No.: US 10,315,232 B2
(45) Date of Patent: Jun. 11, 2019

(54) CLEANING MEMBER AND SUBSTRATE CLEANING APPARATUS

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/569,720

(22) PCT Filed: Feb. 13, 2017

(86) PCT No.: PCT/JP2017/005159
§ 371 (c)(1),
(2) Date: Oct. 26, 2017

(87) PCT Pub. No.: WO2017/179281
PCT Pub. Date: Oct. 19, 2017

(65) Prior Publication Data
US 2018/0126422 A1 May 10, 2018

(30) Foreign Application Priority Data

Apr. 12, 2016 (JP) .................. 2016-079462

(51) Int. Cl.
*B08B 11/00* (2006.01)
*H01L 21/67* (2006.01)
(Continued)

(52) U.S. Cl.
CPC ............... *B08B 1/001* (2013.01); *B08B 1/02* (2013.01); *B08B 11/00* (2013.01);
(Continued)

(58) Field of Classification Search
CPC ........... H01L 21/6704; H01L 21/67046; B08B 11/00
See application file for complete search history.

(56) References Cited

U.S. PATENT DOCUMENTS 6,175,983 B1 * 1/2001 Hirose .................... B08B 1/007
15/102
2002/0100132 A1 * 8/2002 McMullen ................ B08B 1/04
15/102

(Continued)

FOREIGN PATENT DOCUMENTS

JP    H10-092780 A    4/1998
JP    2011-056382 A   3/2011

(Continued)

OTHER PUBLICATIONS

International Patent Application No. PCT/JP2017/005159; Int'l Search Report; dated Mar. 7, 2017; 2 pages.

*Primary Examiner* — Randall E Chin
(74) *Attorney, Agent, or Firm* — Baker & Hostetler LLP

(57) ABSTRACT

A cleaning member 10, for use in cleaning a substrate W, comprises: a tip surface 13 configured to be in contact with the substrate W when cleaning the substrate W, and the tip surface 13 being not covered with a skin layer 11; and a circumferential part having a covered part 16, which is disposed on the base end side and a circumferential surface of which is covered with the skin layer 11, and an exposed part 17, which is disposed on the tip end side and a circumferential surface of which is not covered with the skin layer 11.

10 Claims, 11 Drawing Sheets

(51) Int. Cl.
*B08B 1/00* (2006.01)
*B08B 1/02* (2006.01)
*B08B 3/02* (2006.01)

(52) U.S. Cl.
CPC .... *H01L 21/6704* (2013.01); *H01L 21/67046* (2013.01); *B08B 3/022* (2013.01)

(56) References Cited

U.S. PATENT DOCUMENTS

| | | | |
|---|---|---|---|
| 2008/0141475 A1* | 6/2008 | Drury | B29C 44/385 |
| | | | 15/104.93 |
| 2010/0212702 A1* | 8/2010 | Hamada | H01L 21/02068 |
| | | | 134/115 R |
| 2011/0265279 A1 | 11/2011 | Kawaguchi et al. | |
| 2014/0331440 A1 | 11/2014 | Ishibashi | |
| 2016/0056060 A1 | 2/2016 | Doi | |

FOREIGN PATENT DOCUMENTS

| | | |
|---|---|---|
| JP | 2014-216456 A | 11/2014 |
| JP | 2016-046313 A | 4/2016 |
| WO | WO 2010/001761 A1 | 1/2010 |

* cited by examiner

FIG.8
(a) 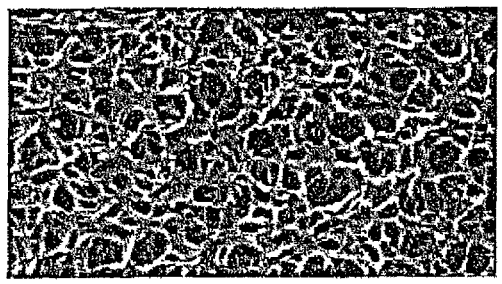
(b) 
FIG.9
(a) 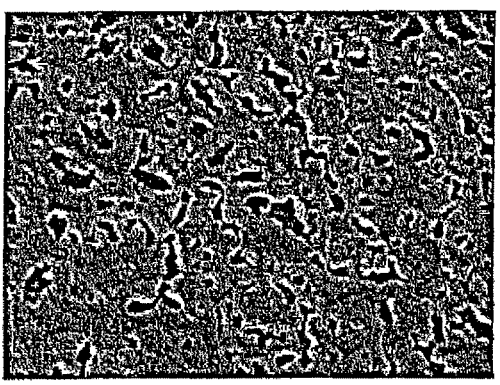
(b) 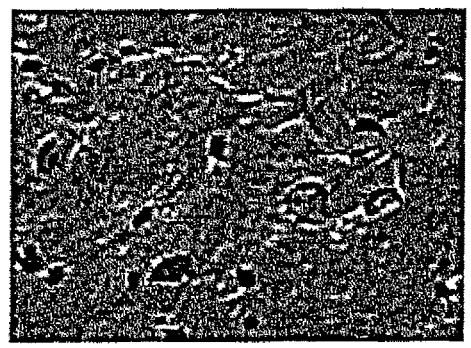
(c) 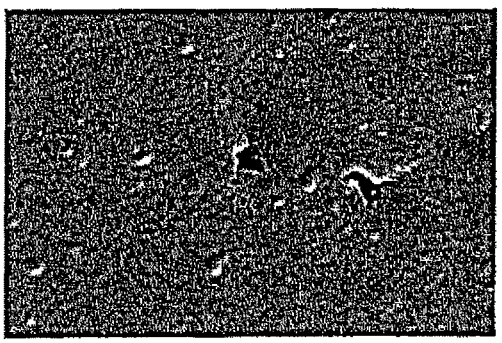

FIG.10
(a)
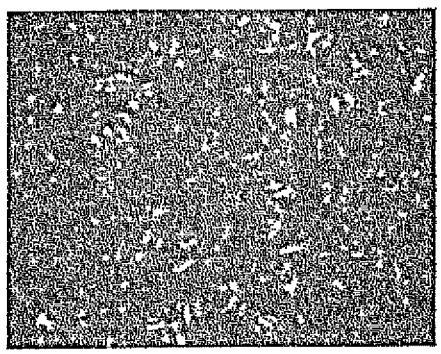
(b)
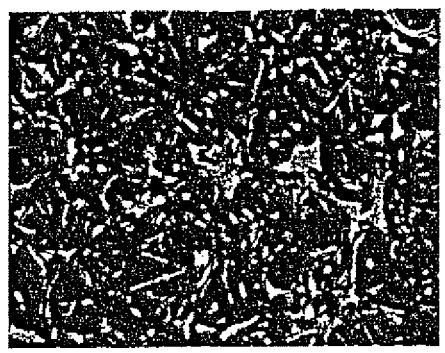
(c)
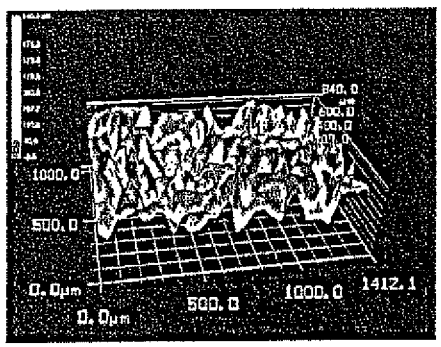

FIG.11
(a) 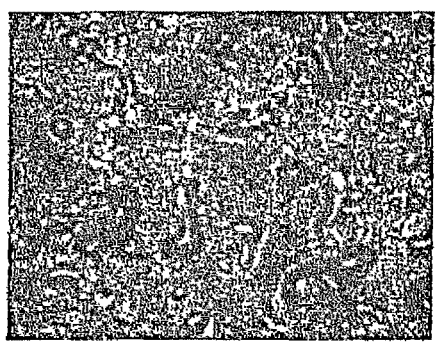
(b) 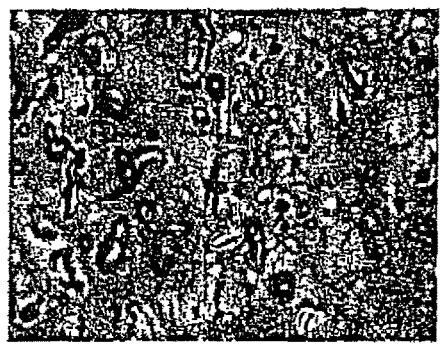
(c) 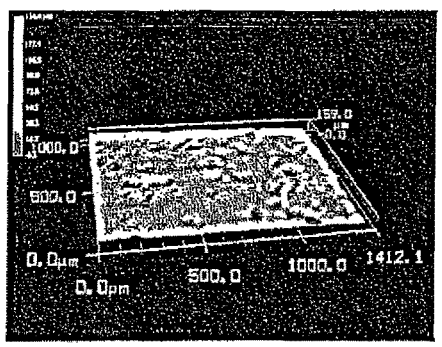

CLEANING MEMBER AND SUBSTRATE CLEANING APPARATUS

TECHNICAL FIELD

The present invention relates to a cleaning member and a substrate cleaning apparatus, which are used to clean a substrate such as a semiconductor wafer.

This application claims a priority of Japanese Patent Application No. 2016-079462 filed on Apr. 12, 2016 and incorporates all the contents of the application by reference.

BACKGROUND ART

Conventionally, a cleaning member with a skin layer for use in cleaning by chemical mechanical polishing (hereinafter referred to as CMP) process is known. Such a cleaning member is manufactured by molding the member, cutting the surface to be in contact with a substrate, and forming a skin layer on the surface that has been in contact with the inner surface of the mold (i.e., the side surface of the cleaning member). The skin layer has continuous pores having smaller diameters than those in the inner part made of sponge and also has a lower porosity than the inner sponge part. Therefore, using the cleaning member with such a skin layer for cleaning can hold sufficient water inside while preventing the liquid inside from leaking out of the surface, which enables the cleaning member to have desired water absorbing properties and water supplying properties during cleaning process. In addition, this cleaning member advantageously does not produce particles substantially and has a long life in general. For example, Japanese Patent Laid Open No. 2011-56382 discloses a sponge member having a shaft and a skin layer.

If a cleaning member with a skin layer on the side surface is used for cleaning by CMP, the skin layer on the side surface may be situated between the cleaning member and a substrate during cleaning process and cause contact contamination on the substrate (in such case, there might be resulting in cleaning irregularities in the circumferential direction. See FIG. 12).

On the other hand, if a cleaning member without a skin layer on the side surface is used, cleaning liquid collide with the bare side surface and go into the cleaning member. As a result, particles in the cleaning liquid may go into the cleaning member and then go down to a substrate to adhere to it. In addition, the cleaning member without a skin layer may not have strength enough to keep the cleaning properties under specific circumstances. Therefore, to avoid an occurrence of contact contamination using the cleaning member without a skin layer for cleaning a substrate seems to be preferable, but from other point of view, the cleaning member without a skin layer seems to be not preferable.

SUMMARY OF THE INVENTION

Problem to be Solved by Invention

As the technology for manufacturing fine semiconductor devices has developed recently, the requirements for substrate processing apparatuses such as cleaning apparatuses are becoming stricter in terms of the cleaning level. And now the measures for preventing the stains due to a cleaning member itself are required.

The present invention has been made to solve the problem. An object of the present invention is to provide a cleaning member and a substrate cleaning apparatus that prevent particles in cleaning liquid from coming inside and prevent the stains due to a skin layer.

Solution to Problem

[Concept 1]
A cleaning member according to the present invention is exemplified as a cleaning member for use in cleaning a substrate, may comprise:
a tip surface configured to be in contact with the substrate when cleaning the substrate, and the tip surface being not covered with a skin layer; and
a circumferential part having a covered part, which is disposed on the base end side and a circumferential surface of which is covered with the skin layer, and an exposed part, which is disposed on the tip end side and a circumferential surface of which is not covered with the skin layer.

[Concept 2]
In the cleaning member according to concept 1,
the exposed part may have a height equal to or more than a length of compression, by which the cleaning member can be compressed at the time of compression.

[Concept 3]
In the cleaning member according to concept 1,
the exposed part may have a height in the range of 1 mm to 5 mm.

[Concept 4]
In the cleaning member according to any one of concepts 1 to 3,
a base surface may not be covered with the skin layer.

[Concept 5]
In the cleaning member according to any one of concepts 1 to 4,
wherein the cleaning member may be a pencil-type cleaning member.

[Concept 6]
In the cleaning member according to any one of concepts 1 to 4,
wherein the cleaning member may be a nodule.

[Concept 7]
In the cleaning member according to any one of concepts 1 to 6,
wherein a tip part of the cleaning member may have a smaller cross section in the part near a tip than in the part near a base.

[Concept 8]
A substrate cleaning apparatus may comprise:
a substrate holder for holding a substrate; and
the cleaning member, according to any one of concepts 1 to 7, used to clean the substrate.

Effects of Invention

According to the present invention, the cleaning member has the tip surface without the skin layer; and the circumferential part having the covered part with the skin layer on the circumferential surface, which is disposed on the base end side, and the exposed part without the skin layer on the circumferential surface, which is disposed on the tip end side. Thus, the cleaning member can prevent particles in cleaning liquid from coming inside as much as possible; and can prevent the contact of the skin layer with the substrate and prevent the contact contamination due to the contact of the skin layer with the substrate as much as possible.

BRIEF DESCRIPTION OF DRAWINGS

FIGS. 8(a) and 8(b) are SEM photographs of a sponge part at a 50-fold magnification.

FIGS. 9(a) and 9(b) are SEM photographs of a skin layer at a 50-fold magnification, and FIG. 9(c) is an SEM photograph of a skin layer at a 250-fold magnification.

FIG. 10(a) is a photograph of a sponge part at a 50-fold magnification, FIG. 10(b) is a 3D photograph of a sponge part at a 50-fold magnification, and FIG. 10(c) is results of measurements of a sponge part by a laser at a 50-fold magnification.

FIG. 11(a) is a photograph of a skin layer at a 50-fold magnification, FIG. 11(b) is a 3D photograph of a skin layer at a 50-fold magnification, and FIG. 11(c) is results of measurements of a skin layer by a laser at a 50-fold magnification.

DESCRIPTION OF EMBODIMENTS

Embodiments

<<Structure>>

An embodiment of a substrate processing apparatus having a substrate cleaning apparatus of the present invention will now be described with reference to the accompanying drawings. FIGS. 1 to 11 illustrate embodiments of the present invention.

Figure 1:
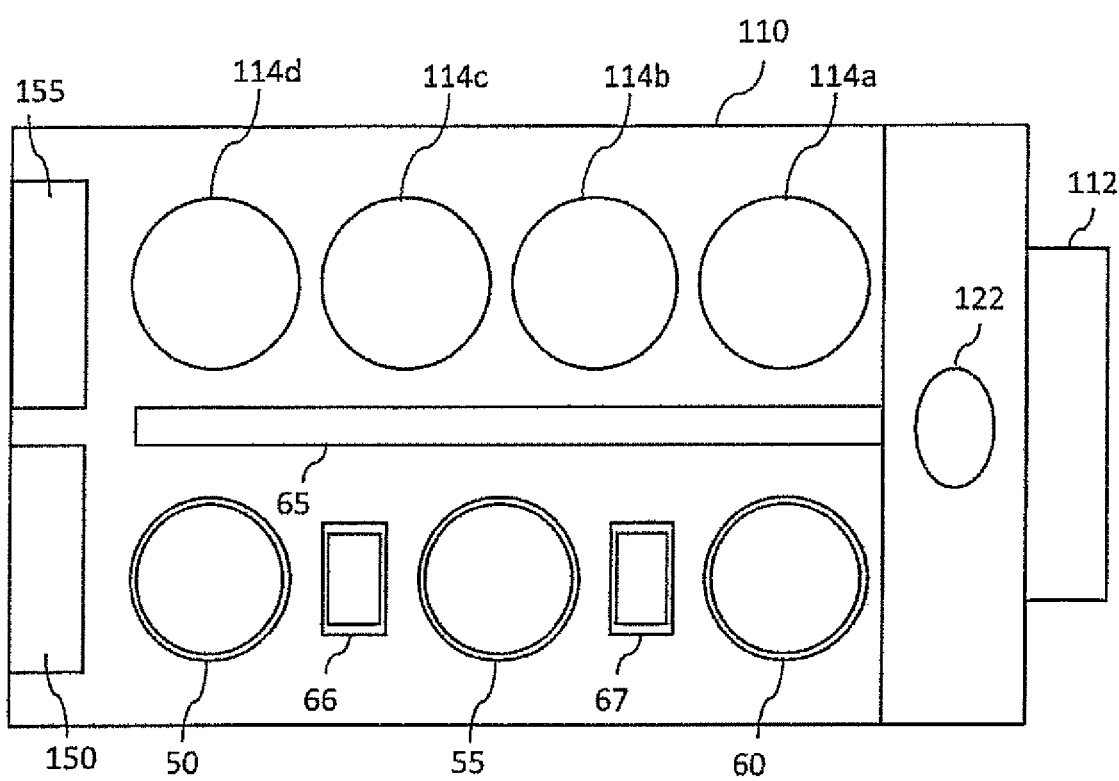
FIG. 1 is a top view of the entire structure of a substrate processing apparatus including a substrate cleaning apparatus according to a first embodiment of the present invention.

As shown in FIG. 1, a substrate processing apparatus has a nearly rectangular housing 110, and a load port 112, on which a substrate cassette for storing many substrates W is disposed. The load port 112 is disposed adjacent to the housing 110. The load port 112 can have an open cassette, a standard mechanical interface (hereinafter referred to as SMIF) pod, or a front opening unified pod (hereinafter referred to as FOUP). The SMIF pod and the FOUP is a closed container that has a substrate cassette inside and a partition wall as a cover for separating its internal environment from the outside space. The substrates W are semiconductor wafers, for example.

The housing 110 holds a plurality of polishing units 114a to 114d (four units in FIG. 1), a first substrate cleaning apparatus 50 and a second substrate cleaning apparatus 55 for cleaning a substrate W after polishing, and a drying unit 60 for drying the substrate W after cleaning. The polishing units 114a to 114d are arranged in the longitudinal direction of the substrate processing apparatus. The substrate cleaning apparatuses 50 and 55 and the drying unit 60 are also arranged in the longitudinal direction of the substrate processing apparatus.

A first transferring robot 122 is disposed in the area surrounded by the load port 112, the polishing unit 114a near the load port 112, and the drying unit 60. A transferring unit 65 is disposed along the polishing units 114a to 114d, and the substrate cleaning apparatuses 50 and 55 and the drying unit 60. The first transferring robot 122 receives a substrate W from the load port 112 and delivers the substrate W to the transferring unit 65 before polishing, or receives a substrate W from the transferring unit 65 after drying at the drying unit 60.

A second transferring robot 66 is disposed between the first substrate cleaning apparatus 50 and the second substrate cleaning apparatus 55 for transferring a substrate W between the first substrate cleaning apparatus 50 and the second substrate cleaning apparatus 55. A third transferring robot 67 is disposed between the second substrate cleaning apparatus 55 and the drying unit 60 for transferring a substrate W between the second substrate cleaning apparatus 55 and the drying unit 60. The housing 110 contains a control unit 150 for controlling the movements of the individual parts of the substrate processing apparatus, and a memory unit 155 for storing various kinds of data. In this embodiment, the housing 110 contains the control unit 150 and the memory unit 155, however, this is not always the case. Alternatively, the control unit 150 and/or the memory unit 155 may be disposed outside the housing 110. In this embodiment, even if the control unit 150 and the memory unit 155 are disposed outside the substrate cleaning apparatuses 50 and 55, the control unit 150 and the memory unit 155 are used to carry out the functions of the substrate cleaning apparatuses 50 and 55. Therefore, the control unit 150 and the memory unit 155 are regarded as parts of the substrate cleaning apparatuses 50 and 55.

In the following description, the first substrate cleaning apparatus 50 is a roller-type cleaning apparatus and the second substrate cleaning apparatus 55 is a pencil-type cleaning apparatus, however, this is not always the case. Alternatively, the first substrate cleaning apparatus 50 may be a pencil-type cleaning apparatus like the second substrate cleaning apparatus 55, or a two-fluid jet cleaning apparatus that cleans the surface of a substrate W with a two-fluid jet. The second substrate cleaning apparatus 55 may be a roller-type cleaning apparatus like the first substrate cleaning apparatus 50, or a two-fluid jet cleaning apparatus that cleans the surface of a substrate W with a two-fluid jet.

Figure 2:
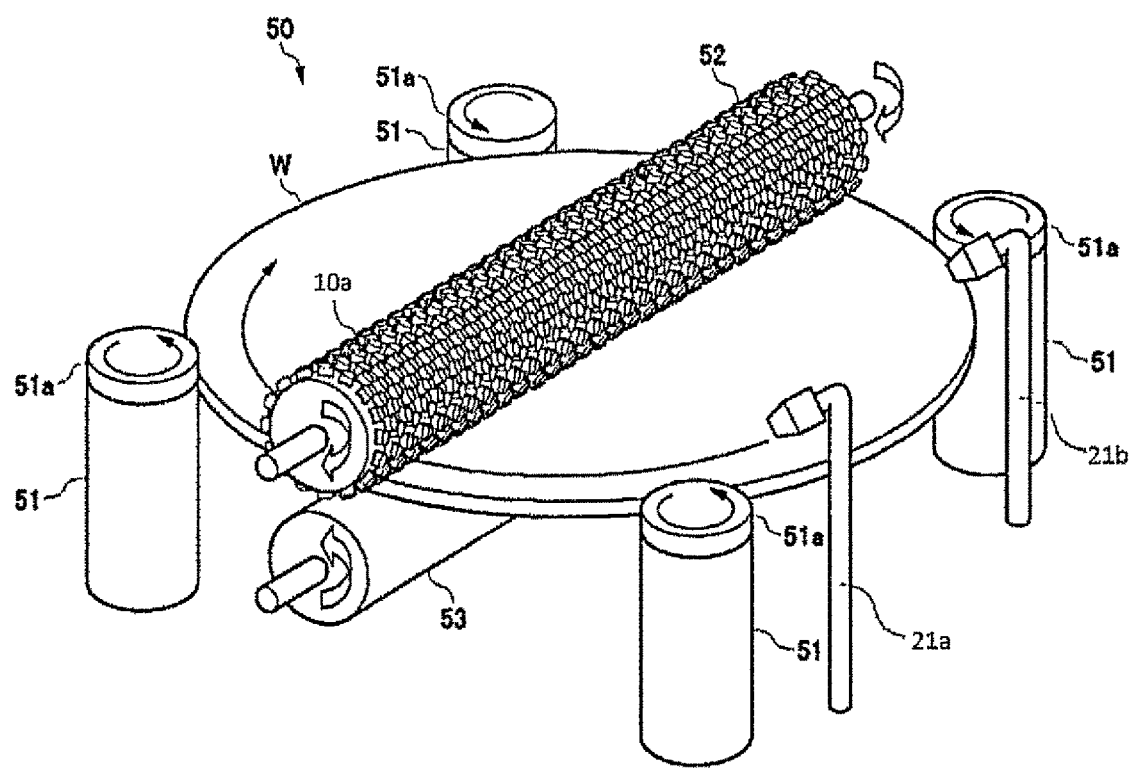
FIG. 2 is a perspective view of a first substrate cleaning apparatus according to an embodiment of the present invention.

In the roller-type cleaning apparatus (the first substrate cleaning apparatus 50) of FIG. 2, linear roller-type cleaning members 52 and 53, which extend substantially across the diameter of a substrate W, revolve around their axes disposed parallel to the substrate W while being in contact with the substrate W to scrub the surface of the substrate W in the presence of cleaning liquid. In the pencil-type cleaning apparatus (the second substrate cleaning apparatus 55) of FIG. 3, a vertically extending cylindrical pencil-type cleaning member 10b spins around its axis and moves in one direction while its lower end surface is in contact with a substrate W to scrub the surface of the substrate W in the presence of cleaning liquid.

The drying unit 60 may be a spin-drying unit that ejects IPA steam from moving nozzles to a substrate W to blow dry the substrate W while spinning the substrate W horizontally at a high speed to dry the substrate W by centrifugal force.

As shown in FIG. 2, the first substrate cleaning apparatus 50 has a plurality of horizontally movable spindles 51 (four spindles in FIG. 2) as a mechanism for spinning a substrate W that spins a substrate W horizontally while supporting the substrate W faceup in contact with the rim of the substrate W, a first roller-type cleaning member (a sponge roller) 52 revolvably supported by a roller holder (not shown), and a second roller-type cleaning member (a sponge roller) 53 revolvably supported by a roller holder (not shown). The first roller-type cleaning member 52 and the second roller-type cleaning member 53 are long cylindrical members made of PVA, for example. The first roller-type cleaning member 52 may be moved up and down by its roller holder with respect to the front surface of the substrate W, and the second roller-type cleaning member 53 may be moved up and down by its roller holder with respect to the rear surface of the substrate W.

The first roller-type cleaning member 52 may be revolved by a driving mechanism (not shown), and the second roller-type cleaning member 53 may be revolved by a driving mechanism (not shown). Two nozzles 21a and 21b are disposed above the substrate W, which is supported and spun by the spindles 51, for supplying cleaning liquid to the surface of the substrate W. The nozzle 21a may supply rinsing liquid (such as deionized water) to the surface of the substrate W, and the nozzle 21b may supply chemical solution to the surface of the substrate W, for example.

In the first substrate cleaning apparatus 50, spindles 51 have pieces 51a with a groove in its outer side surface on the upper part of the spindles. The spindles 51 support the substrate W with the rim of the substrate W in the grooves in the pieces 51a while applying inward pressure to the rim of the substrate W. When the pieces 51a spin around their axes in this state, the substrate W is spun horizontally. In this example, among the four pieces 51a, two pieces 51a apply rotary force to the substrate W and the other two pieces 51a function as bearings for receiving the rotary force from the substrate W. Alternatively, all the four pieces 51a may be connected to a driving mechanism to apply rotary force to the substrate W.

The first roller-type cleaning member 52 and/or the second roller-type cleaning member 53 may have a plurality of nodules 10a on the surface(s). These nodules may be arranged at regular intervals. In the aspect of FIG. 2, the first roller-type cleaning member 52 has the nodules 10a, however, this is not always the case. The inside of the first roller-type cleaning member 52 and/or the second roller-type cleaning member 53 may be supplied with cleaning liquid, which is then supplied to the substrate W from the ends of the nodules. More specifically, cleaning liquid may be supplied into the cylindrical body/bodies of the first roller-type cleaning member 52 and/or the second roller-type cleaning member 53 and then supplied to the substrate W from the ends of the nodules while the nodules are cleaning the substrate W.

Figure 3:
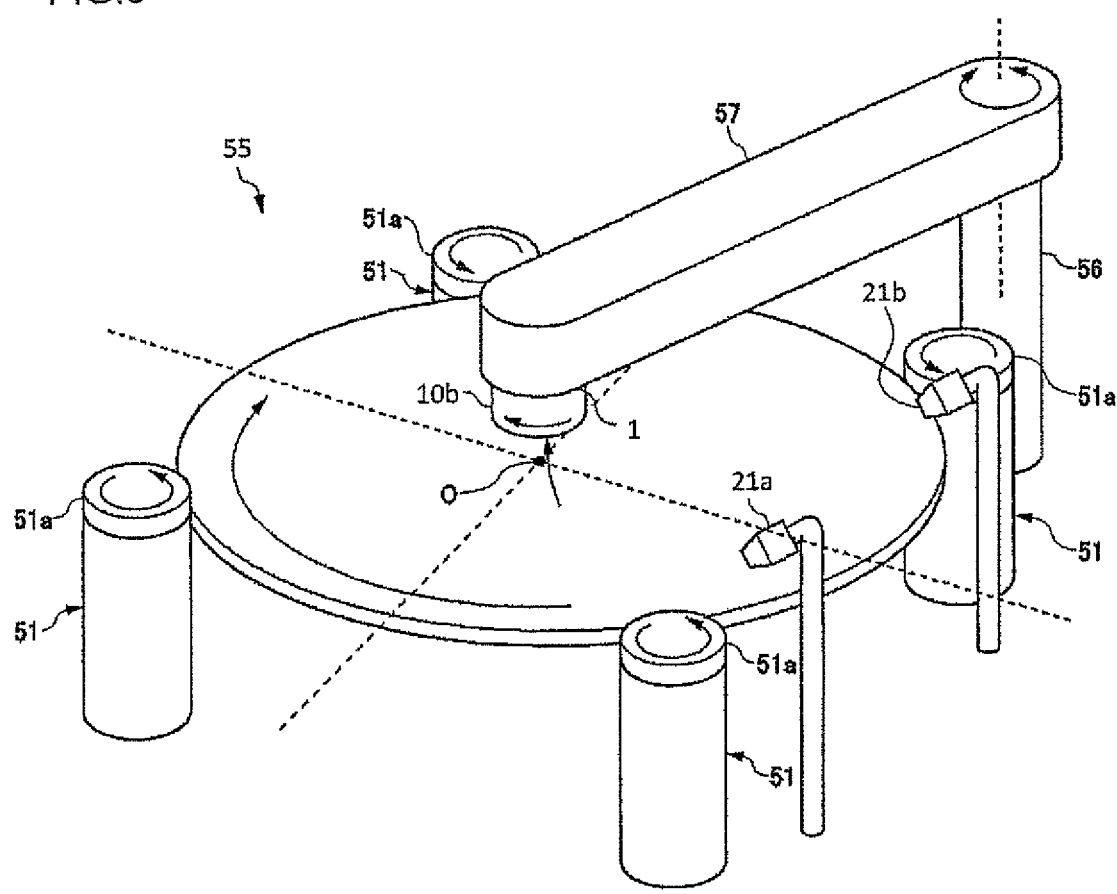
FIG. 3 is a perspective view of a second substrate cleaning apparatus according to an embodiment of the present invention.

As shown in FIG. 3, the second substrate cleaning apparatus 55 has a plurality of spindles 51 (four spindles in FIG. 3) similar to the spindles 51 of the first substrate cleaning apparatus 50 as a mechanism for spinning a substrate, a vertically extending pole 56 that can be moved up and down, a horizontally extending arm 57 with one end rotatably attached to the tip end of the pole 56, and a cylindrical pencil-type cleaning member 10b spinnably and downwardly attached to the other end of the arm 57. Two nozzles 21a and 21b are disposed above the substrate W, which is supported and spun by the spindles 51, for supplying cleaning liquid to the surface of the substrate W, as in the first substrate cleaning apparatus 50. The nozzle 21a may supply rinsing liquid (such as deionized water) to the surface of the substrate W, and the nozzle 21b may supply chemical solution to the surface of the substrate W, for example.

The pencil-type cleaning member 10b is held by a cleaning member holder 1 to be spinnably and downwardly attached to an end of the arm 57, and spun by a driving mechanism (not shown) around its axis. This rotation axis is orthogonal to the substrate W. The pencil-type cleaning member 10b is made of PVA, for example. When the arm 57 moves around the pole 56, the pencil-type cleaning member 10b at the end of the arm 57 moves along an arc on the substrate W. The end of the arm 57 may extend to the center O of the substrate W. In this aspect, the orbit of the pencil-type cleaning member 10b is on the center O of the substrate W. The pencil-type cleaning member 10b may be moved beyond the circumference of the substrate W. The orbit of the pencil-type cleaning member 10b, determined by the movement of the arm 57, can be an arc of a circle with a radius equal to the length of the arm 57. The pencil-type cleaning member 10b may move between the circumference and the position beyond the center O of the substrate W.

Figure 4:
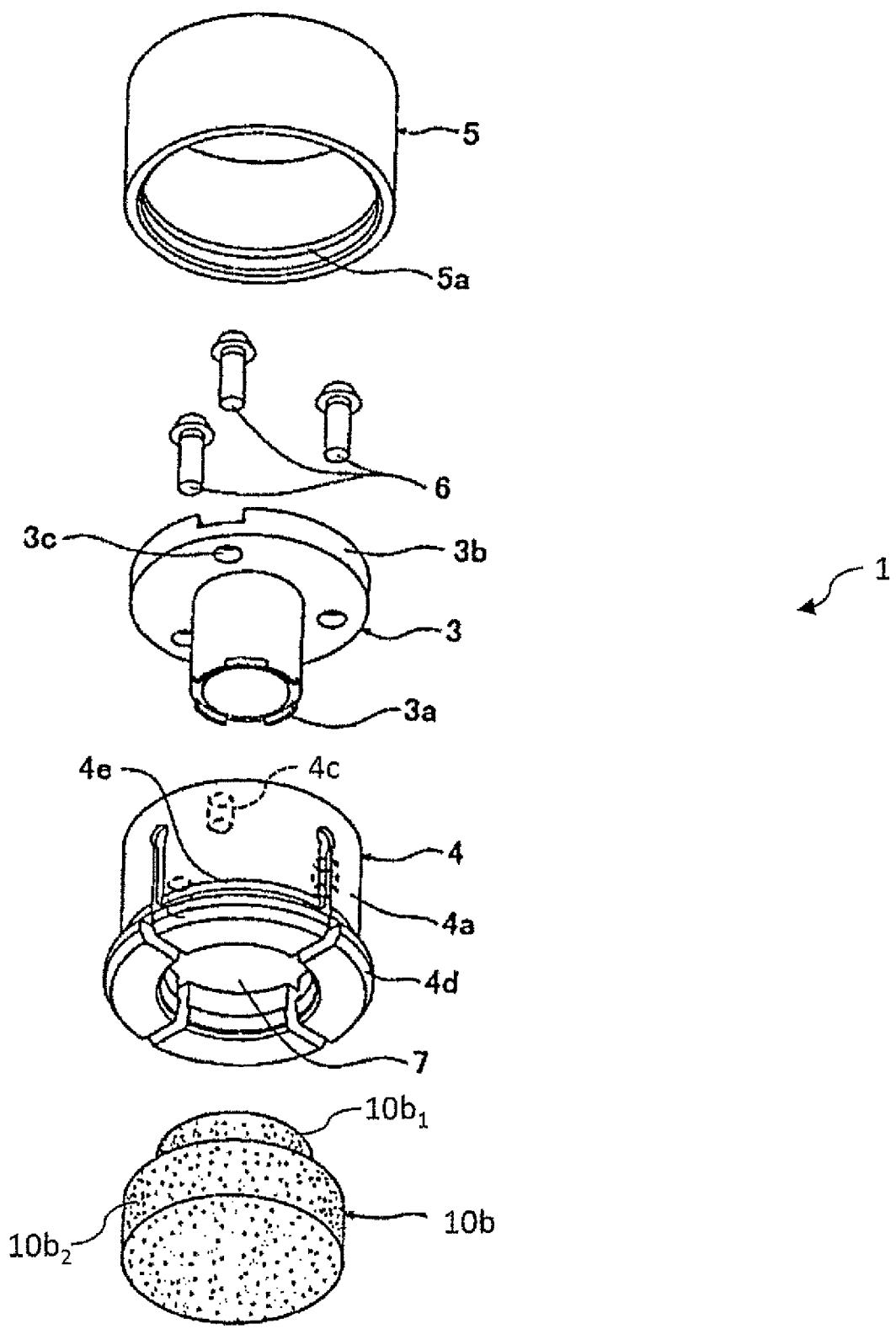
FIG. 4 is a perspective view of a pencil-type cleaning member for use in the second substrate cleaning apparatus according to an embodiment of the present invention.

The arm 57 has the cleaning member holder 1 at the tip end. As shown in FIG. 4, the cleaning member holder 1 may have a holder core 3, a sleeve 4, and a ring 5.

The holder core 3 may have a holder core body 3b having a larger outer diameter at the base, and a plurality of projections 3a on the lower end surface of the holder core body 3b. The holder core body 3b may have a through-hole 3c for accepting a fastener 6 such as a screw.

The sleeve 4 may have a plurality of chucks 4a. The sleeve 4 may have a hole 7 formed by the inner surfaces of the chucks 4a for accepting the base part of the cleaning member 10. The sleeve 4 may have a screw hole 4c for accepting the fastener such as a screw 6 in the base end surface. The sleeve may have a protrusion 4d around the tip outer surface. The protrusion 4d may have a projection 4e around the base outer surface.

The ring 5 may have a cylindrical body having an inner diameter substantially equal to the outer diameter of the sleeve 4. The ring 5 may have a groove 5a for accepting the projection 4e of the sleeve 4 in its inner surface.

The pencil-type cleaning member 10b may have a nearly cylindrical base part $10b_1$, and a nearly cylindrical tip part $10b_2$ having a larger diameter than the base part $10b_1$.

The holder core 3 may be inserted into the central hole of the sleeve 4 until the undersurface of a flange 3b comes into contact with the upper end surface of the sleeve 4. The holder core 3 may be fastened to the sleeve 4 with the fastener such as a screw 6 in this position.

The base part of the pencil-type cleaning member 10b may be inserted into the hole 7 formed by the inner surfaces of the four chucks 4a, and then the sleeve 4 may be inserted into the ring 5. As a result, the chucks 4a spread outward are pressed inward and the projections 4b on the inner surfaces of the chucks 4a bite into the outer surface of the cleaning member 10 to firmly lock the cleaning member 10. In addition, the projections 3a on the lower end surface of the holder core 3 also bite into the upper end surface of the cleaning member 10 to firmly lock the cleaning member 10. The projections 4e on the outer surfaces of the chucks 4a may be engaged with the groove 5a in the inner surface of the ring 5 to firmly attach the sleeve 4 to the ring 5.

As shown in FIGS. 2 and 3, in this embodiment, the spindles 51 support the substrate W as substrate supporting components, however, this is not always the case. Alternatively, the substrate W may be held by chucks as substrate supporting components. In this embodiment, "to support" includes the meaning of "to hold." When the chucks support (hold) the substrate W, the substrate W may be spun by a separate spinning component. When the spindles 51 are used, the substrate W is spun by the spindles 51 while being supported by the spindles 51. The spindles 51 thus have two functions of supporting the substrate W and spinning the substrate W. In FIGS. 2 and 3, the substrate W is supported horizontally, however, this is not always the case. Alternatively, the substrate W may be supported vertically, for example.

In this embodiment, the nozzles 21 are provided as supplying components 20 for supplying cleaning liquid to the substrate W, which is supported by the substrate supporting components, however, this is not always the case.

In this embodiment, examples of the cleaning liquid include rinsing liquid such as deionized water (DIW), and chemical solutions such as a mixture of ammonium hydroxide and hydrogen peroxide (SC1), a mixture of hydrochloric acid and hydrogen peroxide (SC2), a mixture of sulfuric acid and hydrogen peroxide (SPM), a sulfuric acid-hydrogen peroxide mixture, and hydrofluoric acid. In this embodiment, the cleaning liquid means either of rinsing liquid or chemical solution, otherwise described.

The cleaning member 10 for use in the substrate cleaning apparatuses will now be described. More specifically, the cleaning member 10 for the pencil-type cleaning member 10*b* or each nodule 10*a* of the roller-type cleaning member will now be described. The "substrate cleaning apparatus" means either of the first substrate cleaning apparatus 50 or the second substrate cleaning apparatus 55, or both of the first substrate cleaning apparatus 50 and the second substrate cleaning apparatus 55, otherwise described.

Figure 5:
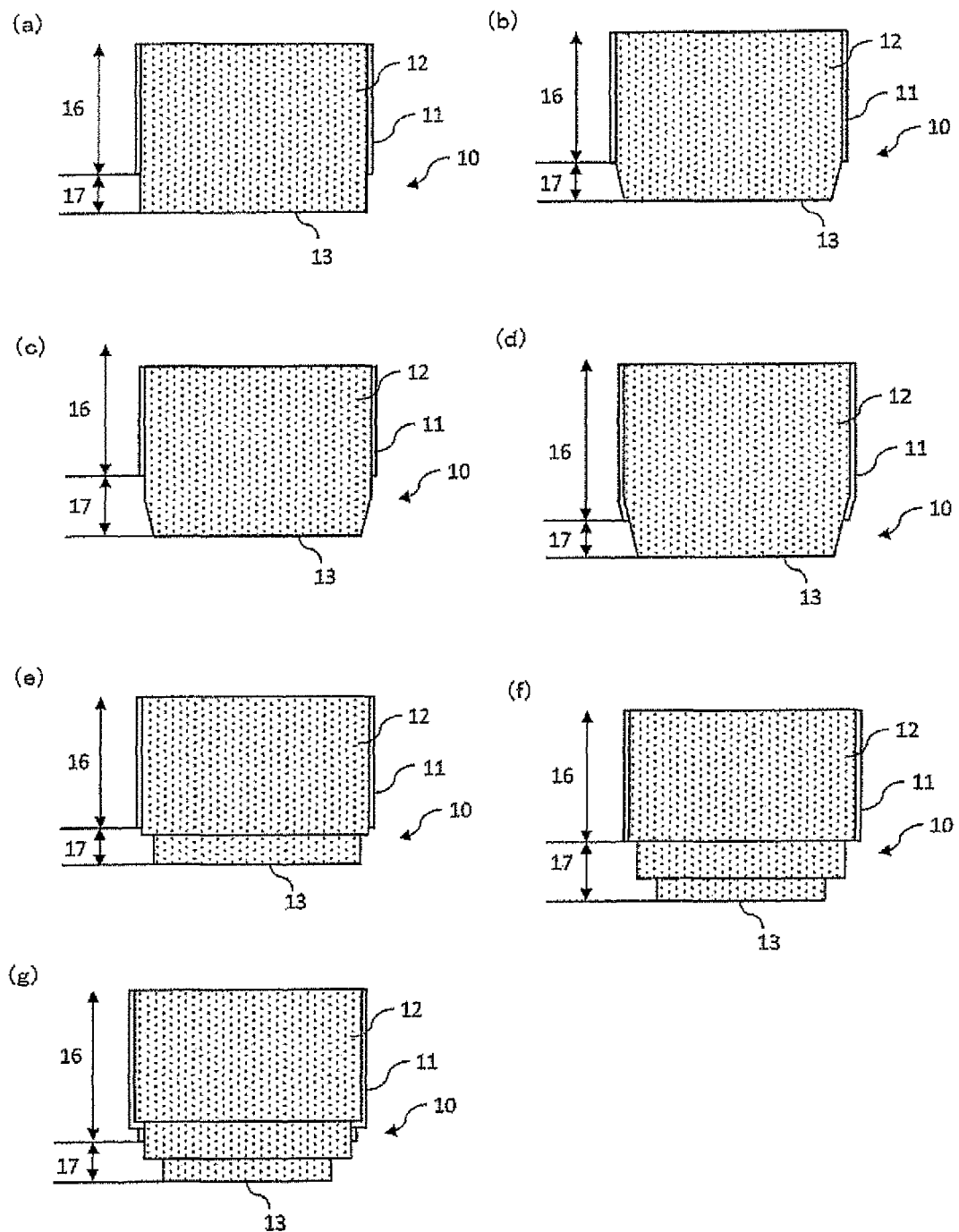
FIGS. 5(a) to 5(g) are cross-sectional side views of a cleaning member for use in an embodiment of the present invention.
Figure 6:
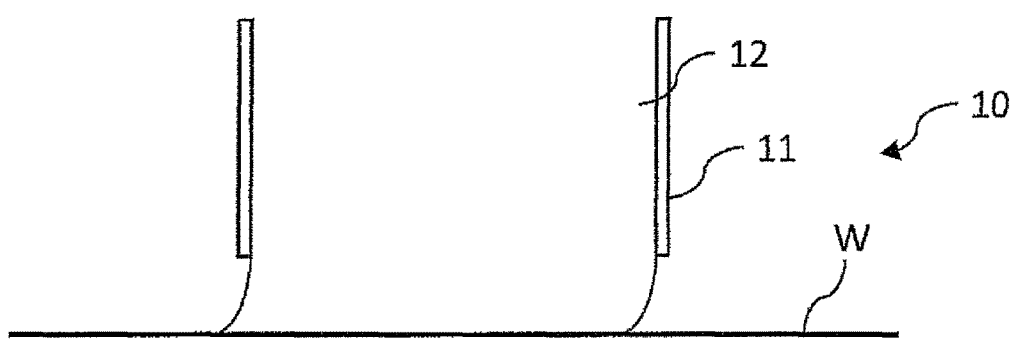
FIG. 6 is a cross-sectional side view of a cleaning member, which is cleaning a substrate, for use in an embodiment of the present invention.
Figure 7:
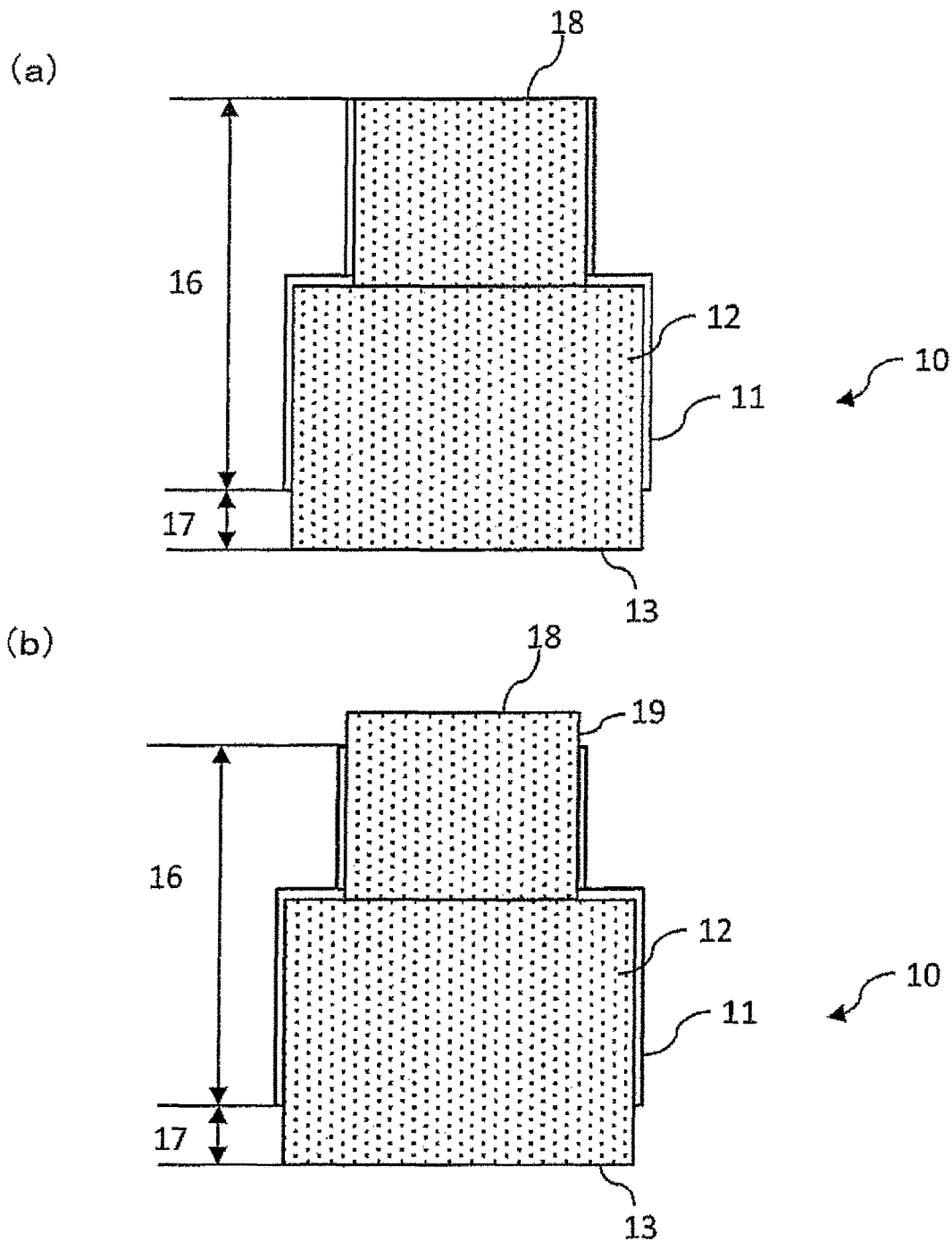
FIGS. 7(a) and 7(b) are cross-sectional side views of a cleaning member for use in a modified embodiment of the present invention.

As shown in FIGS. 5 to 7, the cleaning member 10 of this embodiment has a tip surface 13 configured to be in contact with a substrate W when cleaning the substrate W, and a circumferential part having a covered part 16 disposed on the base end side and an exposed part 17 disposed on the tip end side. In the tip surface 13, the sponge part 12 is not covered with the skin layer 11. In the covered part 16, the circumferential surface of the sponge part 12 is covered with the skin layer 11. In the exposed part 17, the circumferential surface of the sponge part 12 is not covered with the skin layer 11. The cleaning member 10 of this embodiment is a collective term for the nodules 10*a* or the pencil-type cleaning member 10*b* and means either of the nodules 10*a* or the pencil-type cleaning member 10*b*, otherwise described.

The exposed part 17 may have a height equal to or more than the length of compression by which the cleaning member 10 can be compressed at the time of compression. The length of compression is determined by a force applied to the cleaning member 10 for compression and a material of the cleaning member 10. The "length of compression" may be measured in a pretest, or may be calculated by simulation. The "length of compression" may be determined based on the length of contraction in the specification. In this case, the "length of compression" should be equal to or more than the length of contraction in the specification. The "length of contraction" in the specification means the length by which the cleaning member 10 can be contracted when applying a predetermined force (2N, for example) to the cleaning member 10 without spinning the substrate W and the cleaning member 10.

The "length of compression" can be changed between the case in which the nodule 10*a* is used as the cleaning member 10 and the case in which the pencil-type cleaning member 10*b* is used as the cleaning member 10. The length of compression for the nodule 10*a* can be shorter the length of compression for the pencil-type cleaning member 10*b*.

The exposed part 17 may have a height in the range of 1 mm to 5 mm, for example. When the cleaning member 10 is used for the pencil-type cleaning member 10*b*, the exposed part 17 may have a height in the range of 1 mm to 5 mm. When the cleaning member 10 is used for the nodules 10*a*, the exposed part 17 may have a height in the range of 1 mm to 3 mm.

As shown in FIGS. 7(*a*) and 7(*b*), the cleaning member 10 may have a base surface 18. The base surface 18 may not be covered with the skin layer 11. As shown in FIG. 7(*b*), a circumferential part 19 on the base end side may not be covered with the skin layer 11 and the sponge part 12 may be exposed in the circumferential part 19.

The tip part of the cleaning member 10 may have a larger cross section (a horizontal cross section) in the part near the tip than in the part near the base. For example, as shown in FIGS. 5(*b*), 5(*c*), and 5(*d*), the tip part of the cleaning member 10 may be tapered toward the tip and have a trapezoidal vertical cross section. Alternatively, as shown in FIGS. 5(*e*), 5(*f*), and 5(*g*), the tip part of the cleaning member 10 may be stepped decreasingly toward the tip to have a stepped vertical cross section. The tip part of the cleaning member 10 may have a smaller cross section in the exposed part 17 than in the covered part 16. For example, the tip part of the cleaning member 10 may have a cross section continuously or intermittently decreasing from the border between the exposed part 17 and the covered part 16 toward the tip in the exposed part 17 (See FIGS. 5(*b*) and 5(*f*)). Alternatively, the tip part of the cleaning member 10 may have a cross section continuously or intermittently decreasing from the tip side position relative to the border between the exposed part 17 and the covered part 16 toward the tip in the exposed part 17 (See FIGS. 5(*c*) and 5(*e*)). Alternatively, the tip part of the cleaning member 10 may have a cross section continuously or intermittently decreasing from the base side position relative to the border between the exposed part 17 and the covered part 16 toward the tip in the exposed part 17 (See FIGS. 5(*d*) and 5(*g*)).

Figure 12:
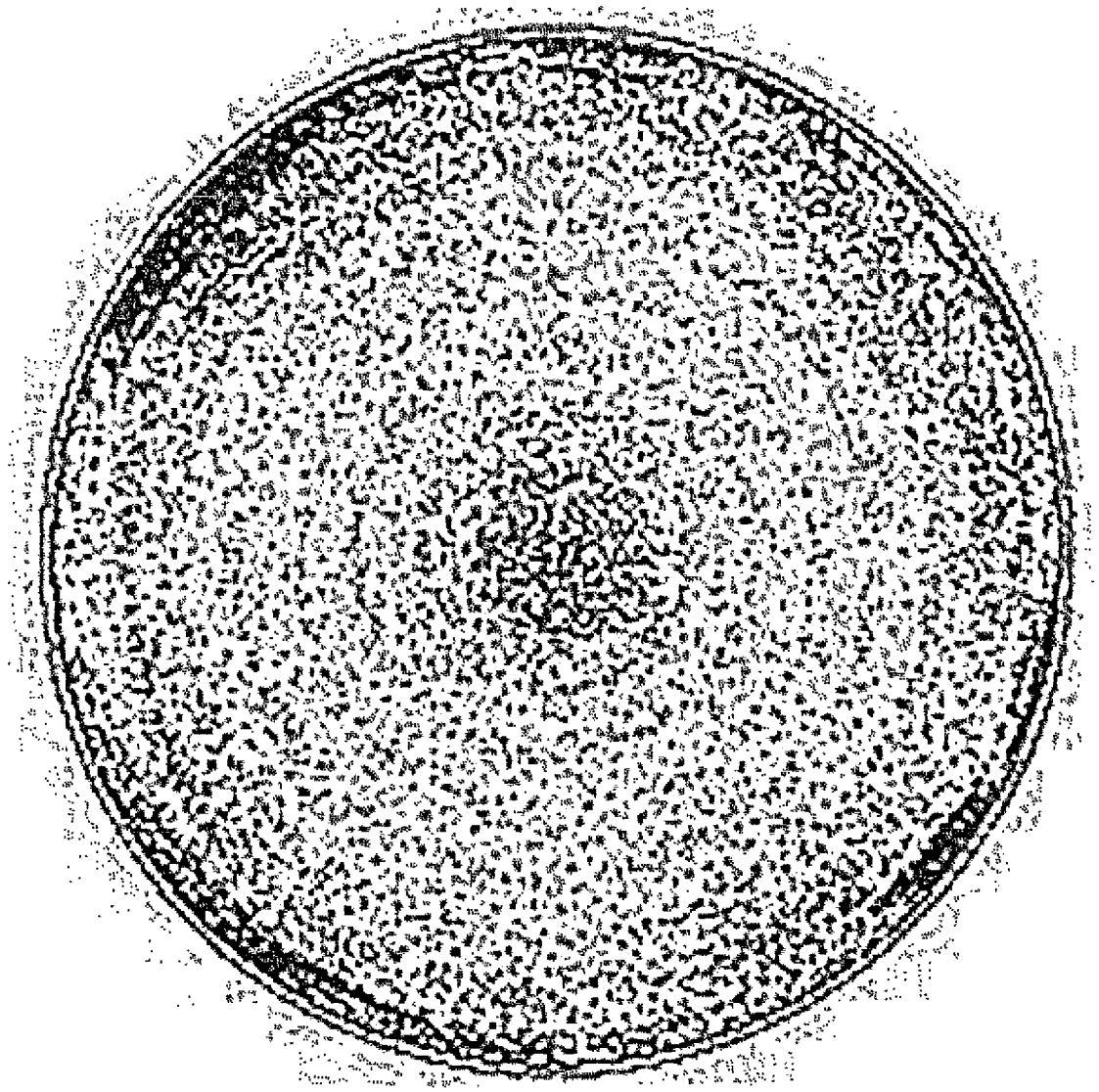
FIG. 12 is a photograph of an example of the surface of a substrate after being cleaned by a cleaning member (a pencil-type cleaning member) with a skin layer on its side surface, showing fine debris on the substrate.

As shown in FIG. 6, the cleaning member 10 is subjected to the friction with a substrate W in the direction opposite to the moving direction while cleaning the substrate W. The tip part of the cleaning member 10 is thus pulled in the direction opposite to the moving direction. If the circumferential part of the tip part of the cleaning member 10 is covered with the skin layer 11 to the tip end, the skin layer 11 is pulled in the direction opposite to the moving direction and causes contact contaminants on the substrate W (See FIG. 12, for example).

<<Effects>>

The advantageous effects of the embodiments having the above characteristics and especially the advantageous effects that have not been described yet will now be described.

In the above embodiment, the cleaning member 10 has the tip surface 13 without the skin layer 11; and the circumferential part having the covered part 16 with the skin layer 11 on the circumferential surface, which is disposed on the base end side, and the exposed part 17 without the skin layer 11 on the circumferential surface, which is disposed on the tip end side. The cleaning member 10 can prevent particles in cleaning liquid from coming inside as much as possible; and can prevent the contact of the skin layer with the substrate. As a result, the cleaning member 10 can prevent particles in cleaning liquid from contaminating the substrate W and can prevent the contact contamination due to the contact of the skin layer 11 with the substrate W. Especially in a final cleaning, even the contact contamination may be a problem. In this respect, this embodiment is advantageous because the contact contamination can be prevented.

It is obvious by comparing FIGS. 8 and 10 illustrating the sponge part 12 and FIGS. 9 and 11 illustrating the skin layer 11 that the sponge part 12 has a higher porosity than the skin layer 11. Therefore, the sponge part 12 hardly cause contact contamination while scrubbing a substrate W for cleaning.

In the above aspect, the exposed part 17 has a height equal to or more than the length of compression by which the cleaning member 10 can be compressed at the time of compression, which surely prevents the skin layer 11 on the side surface from going into the contact surface for the substrate W and from causing contact contamination.

If the exposed part 17 has a too small height, the skin layer 11 will cause contact contamination. Taking this into consideration, it is advantageous that the exposed part 17 has a height of 1 mm or more. If the exposed part 17 has a too great height, particles in cleaning liquid will go into the cleaning member 10 and then go to a substrate and adhere to the substrate. In addition, the exposed part 17 with a too great height may not have strength enough to keep the cleaning properties. Taking these into consideration, it is advantageous that the exposed part 17 has a height of 5 mm or less. When the cleaning member 10 is used for the nodules 10a, each of which is subjected to a relatively small force, the exposed part 17 may have a height of 3 mm or less.

When cleaning liquid is supplied through the base surface 18, cleaning liquid from the base surface 18 can selectively be supplied to a substrate through the exposed part 17, which is advantageous. For example, cleaning liquid is supplied into the cylindrical body/bodies of the first roller-type cleaning member 52 and/or the second roller-type cleaning member 53 and then supplied to a substrate W from the tip ends of the nodules while the nodules are cleaning the substrate W (See FIG. 2). In this respect, when the base surface 18 is not covered with the skin layer 11 as shown in FIGS. 7(a) and 7(b), cleaning liquid can be taken into the cleaning member 10 through the base surface 18 and then efficiently be supplied to a substrate through the tip surface 13 and the exposed part 17 on the tip end side of the cleaning member 10, which is advantageous. Especially when the base part has the circumferential part 19 without the skin layer 11 and the sponge part 12 is exposed in the circumferential part 19 as shown in FIG. 7(b), cleaning liquid can easily be taken into by the exposed sponge part 12, which is advantageous.

When the tip part of the cleaning member 10 has a smaller cross section (a horizontal cross section) in the part near the tip than in the part near the base as shown in FIG. 5(b) to 5(g), the deformation of the cleaning member 10 can be restricted and thus the force applied to a substrate can be stabilized, which is advantageous. In this embodiment, since the exposed part 17 without the skin layer 11 on the circumferential surface is disposed on the tip end side, the cleaning member 10 can easily spread at the tip end. This embodiment is very advantageous for stabilizing the force applied to a substrate.

When the tip part of the cleaning member 10 is tapered and have a trapezoidal vertical cross section as shown in FIGS. 5(b), 5(c), and 5(d), the cleaning member 10 is advantageously tapered gradually toward the tip, which is easily deformed. When the tip part of the cleaning member 10 is stepped decreasingly toward the tip to have a stepped vertical cross section as shown in FIGS. 5(e), 5(f), and 5(g), the cleaning member 10 can advantageously change its shape toward the tip, which is easily deformed.

When the tip part of the cleaning member 10 has a cross section continuously or intermittently decreasing from the border between the exposed part 17 and the covered part 16 toward the tip in the exposed part 17 as shown in FIGS. 5(b) and 5(f), the cleaning member 10 can easily be manufactured by partially removing the skin layer 11 on the tip end side, which is advantageous. When the tip part of the cleaning member 10 has a cross section continuously or intermittently decreasing from the tip side position relative to the border between the exposed part 17 and the covered part 16 toward the tip in the exposed part 17 as shown in FIGS. 5(c) and 5(e), the cross section of the exposed part 17, which is easily deformed, can surely be reduced, which is advantageous. When the tip part of the cleaning member 10 has a cross section continuously or intermittently decreasing from the base side position relative to the border between the exposed part 17 and the covered part 16 toward the tip in the exposed part 17 as shown in FIGS. 5(d) and 5(g), the deformation of the exposed part 17 can be restricted, which is advantageous.

Lastly, descriptions on the aforementioned embodiment as well as disclosed drawings are merely examples for describing the invention described in CLAIMS. The descriptions on the aforementioned embodiment or disclosed drawings should not be construed to limit the invention described in CLAIMS.

DESCRIPTION OF REFERENCE NUMERALS

10 Cleaning member
10b Pencil-type cleaning member
10a Nodule
11 Skin layer
16 Covered part (Circumferential part)
17 Exposed part (Circumferential part)
W Substrate

What is claimed is:

1. A cleaning member for use in cleaning a substrate, comprising:
    a flat tip surface configured to be in contact with the substrate when cleaning the substrate, and the tip surface being not covered with a skin layer; and
    a circumferential part having a covered part, which is disposed on a base end side and is covered with the skin layer, and an exposed part, which is disposed on a tip end side and is not covered with the skin layer.

2. The cleaning member according to claim 1, wherein the exposed part has a height equal to or more than a length of compression, by which the cleaning member can be compressed at the time of compression.

3. The cleaning member according to claim 1, wherein the exposed part has a height in the range of 1 mm to 5 mm.

4. The cleaning member according to claim 1, wherein a base surface, which is a surface disposed on an opposite side of the tip surface, is not covered with the skin layer.

5. The cleaning member according to claim 1, wherein the cleaning member is a pencil-type cleaning member.

6. The cleaning member according to claim 1, wherein the cleaning member is a nodule.

7. The cleaning member according to claim 1, wherein the exposed part is tapered toward the tip end side and has a trapezoidal vertical cross section, or the exposed part is stepped decreasingly toward the tip end side and has a stepped vertical cross section.

8. The cleaning member according to claim 1, wherein a cross-sectional side view of the exposed part has a rectangle shape.

9. A substrate cleaning apparatus comprising:
a substrate holder for holding a substrate; and
the cleaning member, according to claim 1, used to clean the substrate.

10. A pencil-type cleaning member for use in cleaning a substrate, comprising:
a sponge part,
wherein the sponge part has
a base surface being not covered with a skin layer,
a tip surface configured to be in contact with the substrate when cleaning the substrate and being not covered with a skin layer, and
a circumferential part having a covered part, which is disposed on a base end side of the sponge part and covered with the skin layer, and an exposed part, which is disposed on a tip end side of the sponge part and is not covered with the skin layer.

* * * * *